(12) United States Patent
Hamada et al.

(10) Patent No.: US 7,255,938 B2
(45) Date of Patent: Aug. 14, 2007

(54) ORGANIC ELECTROLUMINESCENT DEVICE AND ORGANIC COMPOUND FOR USE IN ORGANIC ELECTROLUMINESCENT DEVICE

(75) Inventors: Yuji Hamada, Nara (JP); Nobuo Saito, Gifu (JP); Kazuki Nishimura, Hirakata (JP); Hiroshi Kanno, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 142 days.

(21) Appl. No.: 10/950,669

(22) Filed: Sep. 28, 2004

(65) Prior Publication Data

US 2005/0118456 A1    Jun. 2, 2005

(30) Foreign Application Priority Data

Sep. 30, 2003   (JP) .............................. 2003-342592

(51) Int. Cl.
*H01L 51/50*   (2006.01)
(52) U.S. Cl. ...................... 428/690; 428/917; 313/504; 313/506
(58) Field of Classification Search ................ 428/690, 428/917; 313/504, 506
See application file for complete search history.

(56) References Cited

U.S. PATENT DOCUMENTS

| 5,281,489 A * | 1/1994 | Mori et al. ................... 428/690 |
| 2002/0086180 A1* | 7/2002 | Seo et al. .................... 428/690 |
| 2003/0215667 A1* | 11/2003 | Xie ............................ 428/690 |

FOREIGN PATENT DOCUMENTS

| JP | 4-334894 A | 11/1992 |
| JP | 9-63770 A | 3/1997 |
| JP | 10-36832 A | 2/1998 |
| JP | 10-294179 A | 11/1998 |
| JP | 2000-164362 A | 6/2000 |
| JP | 2001-338761 A | 12/2001 |
| JP | 2003-51388 A | 2/2003 |
| JP | 2004-146221 A | 5/2004 |

* cited by examiner

*Primary Examiner*—Dawn L. Garrett
(74) *Attorney, Agent, or Firm*—Kubovcik & Kubovcik

(57) ABSTRACT

An organic electroluminescent device includes a hole-injecting electrode, an electron-injecting electrode and a blue light-emitting layer which is provided between the electrodes and contains a host material, a luminescent dopant and an assist dopant for complementing carrier transport of the host material. When the host material is an electron-transporting material, the assist dopant has a smaller absolute HOMO (Highest Occupied Molecular Orbital) energy level than the host material and a higher hole mobility than the host material.

9 Claims, 1 Drawing Sheet

ORGANIC ELECTROLUMINESCENT DEVICE AND ORGANIC COMPOUND FOR USE IN ORGANIC ELECTROLUMINESCENT DEVICE

BACKGROUND OF THE INVENTION

1. Field of the Invention

The invention relates to an organic electroluminescent device and an organic compound for use in such an organic electroluminescent device and particularly to an organic electroluminescent device having a blue light-emitting layer and an organic compound which can be used as a blue light-emitting material for an organic electroluminescent device.

2. Description of the Related Art

Organic electroluminescent devices are a light-emitting device in which holes injected from a hole-injecting electrode and electrons injected from an electron-injecting electrode are recombined at an interface between a light-emitting layer and a carrier-transporting layer or recombined in a light-emitting layer to produce light emission. Such organic electroluminescent devices can be driven by relatively low voltage as compared with inorganic electroluminescent devices, and thus their application to flat panel displays particularly has received attention in recent years.

Luminescent materials can be selected so as to form an organic electroluminescent device capable of emitting light of the desired color. Thus, organic electroluminescent devices are expected to be a multicolor or full-color display device.

Organic electroluminescent devices have been required to have high brightness, high luminous efficiency, and high reliability. Japanese Patent Application Laid-Open (JP-A) No. 2000-164362 discloses an organic electroluminescent device comprising a red light-emitting layer or a green light-emitting layer and a carrier-transporting layer, wherein the carrier-transporting layer and/or the light-emitting layer is doped with a dopant for transporting carriers or for transferring excitation energy so that emission properties and lifetime can be improved.

However, such improvements are not specifically investigated for organic electroluminescent devices having a blue light-emitting layer. Thus, there has been a demand for an organic electroluminescent device with a blue light-emitting layer, which can have improved luminous efficiency and improved reliability.

SUMMARY OF THE INVENTION

It is an object of the invention to provide an organic electroluminescent device comprising a blue light-emitting layer which can have high luminous efficiency and high reliability and to provide an organic compound which can be used as a blue light-emitting material for such an organic electroluminescent device.

The invention is directed to an organic electroluminescent device, comprising: a hole-injecting electrode; an electron-injecting electrode; and a light-emitting layer provided between the hole-injecting electrode and the electron-injecting electrode, wherein the light-emitting layer is a blue light-emitting layer which contains a host material, a luminescent dopant and an assist dopant for complementing carrier transport of the host material.

According to the invention, the blue light-emitting layer contains a host material, a luminescent dopant and an assist dopant. The assist dopant complements carrier transport of the host material. Thus, the carrier transport is accelerated by the assist dopant in the light-emitting layer so that the probability of carrier recombination can be increased and that the luminous efficiency is increased. Thus, the reliability can also be increased.

In the light-emitting layer, the content of the host material is generally higher than that of any other component. The host material serves to facilitate the film formation of the light-emitting layer and to support the light-emitting layer film. Thus, the host material should be stable and should be resistant to crystallization after the film production and resistant to chemical change. When an electric current is applied between the electrodes, carriers are generally recombined in the host molecule. Thus, the host material plays a role in transferring the excitation energy to the luminescent dopant and allowing the luminescent dopant to emit light.

The luminescent dopant is a fluorescent or phosphorescent compound, which receives excitation energy from the host molecule and is excited and quenched to emit light.

The assist dopant plays a role in complementing the carrier transport properties of the host material and accelerating the injection and transfer of the carriers into the light-emitting layer.

If the host material is an electron-transporting material, namely, a material that dominantly causes electron transfer rather than hole transfer, the assist dopant should be a hole-transporting material, which is a material that dominantly causes hole transfer rather than electron transfer. If the host material is a hole-transporting material, on the other hand, the assist dopant should be an electron-transporting material. If the light-emitting layer contains both the hole-transporting material and the electron-transporting material, which have opposite properties, in a mixed manner, namely, if the light-emitting layer itself is bipolar or capable of transporting both types of carriers, it can have an increased probability of recombination in the light-emitting layer and thus have improved luminous efficiency.

The hole-transporting material serving as the assist dopant preferably has a smaller absolute HOMO (Highest Occupied Molecular Orbital) energy level than the host material and a higher hole mobility than the host material. The electron-transporting material serving as the assist dopant preferably has a larger absolute LUMO (Lowest Unoccupied Molecular Orbital) energy level than the host material and a higher electron mobility than the host material.

The electron-transporting host material may be an anthracene derivative. In this case, the hole-transporting material is used as the assist dopant as stated above. Such a hole-transporting assist dopant may be a phenylamine derivative. In this case, examples of the luminescent dopant include a perylene derivative, an oxadiazole derivative or an anthracene derivative etc.

In the invention, the assist dopant may be contained only in a partial region of the blue light-emitting layer along its thickness direction. Namely, the blue light-emitting layer comprises the host material, the luminescent dopant and the assist dopant, wherein the assist dopant may be contained only in a partial region along the thickness direction of the blue light-emitting layer. In this case, the other region only contains the host material and the luminescent dopant. If the assist dopant-containing region is restricted in such a manner, the carriers would be efficiently transferred to the light-emitting region so that the probability of recombination can be increased and the luminous efficiency can be improved.

In a preferred mode of the invention, the blue light-emitting layer has a luminescence peak wavelength of from 450 nm to 520 nm, and the color of the emitted light is blue to blue-green.

The invention is also directed to an organic compound for use in an organic electroluminescent device, comprising an anthracene derivative represented by Structural Formula (1) below (hereinafter also referred to as DBzA).

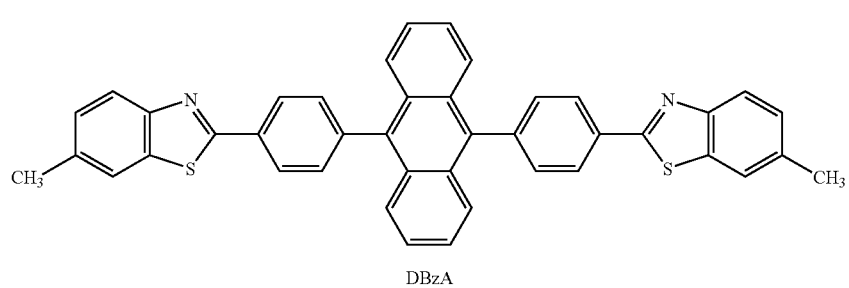

DBzA

The above organic compound may be used as a luminescent material for an organic electroluminescent device, specifically as the luminescent dopant according to the invention.

The above organic compound may be used as a blue light-emitting material.

According to the invention, the organic electroluminescent device comprising the blue light-emitting layer can have high luminous efficiency and high reliability.

DESCRIPTION OF THE PREFERRED EMBODIMENTS

Figure 1:
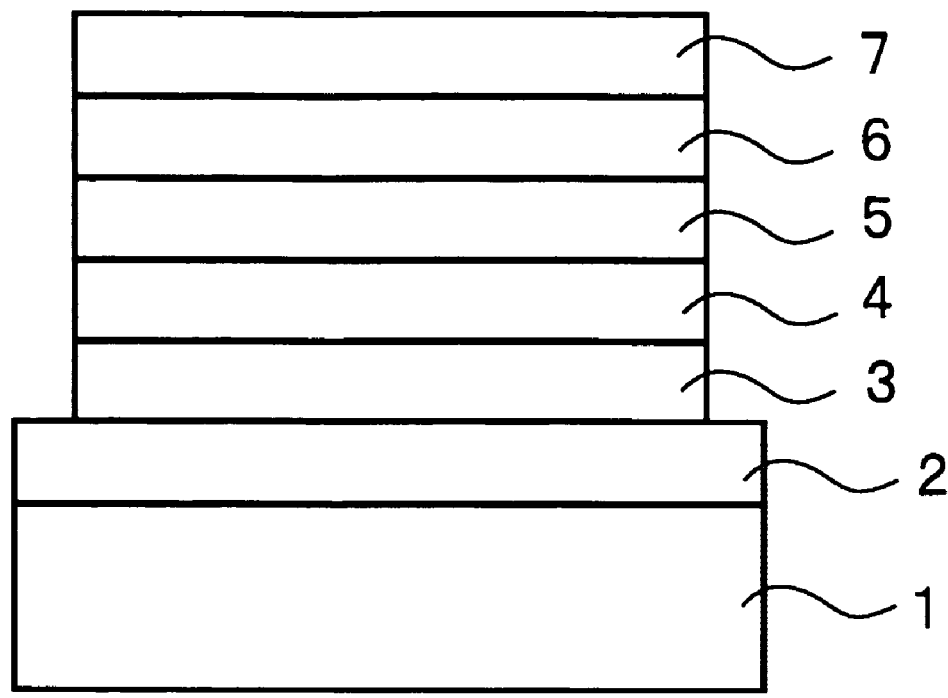
FIG. 1 is a schematic cross-sectional view showing an organic electroluminescent device prepared in Examples according to the invention.

The invention is described in more detail by means of the examples below, which are not intended to limit the scope of the invention. It will be understood that various modifications can be made thereto without departing from the gist of the invention.

Host Material

The anthracene derivative represented by Structural Formula (2) below (hereinafter referred to as DNA) is used as the host material in the examples and the comparative examples.

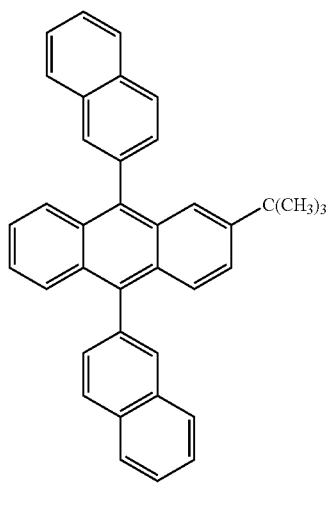

DNA

Examples of any other anthracene derivative to be used as host material include analogues of the Formula (2) compound which have any other substituent in place of the substituent $C(CH_3)_3$ and other analogues of the Formula (2) compound which have the substituent $C(CH_3)_3$ or any other substituent at any other position.

Luminescent Dopant

DBzA, the perylene derivative represented by Structural Formula (3) below and the oxadiazole derivative represented by Structural Formula (4) below are used as the luminescent dopants in the examples and the comparative examples.

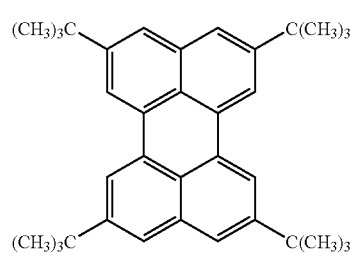

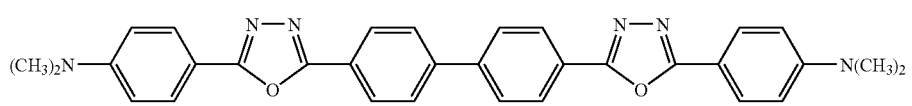

(4)

Examples of the anthracene derivative to be used as luminescent dopant include DBzA analogues having any other substituent in place of the substituent $CH_3$ and other analogues which have the substituent $CH_3$ or any other substituent at any other position.

Examples of any other perylene derivative to be used as luminescent dopant include analogues of the Formula (3) compound which have any other substituent in place of the substituent $C(CH_3)_3$ and other analogues of the Formula (3) compound which have the substituent $C(CH_3)_3$ or any other substituent at any other position.

Examples of any other oxadiazole derivative to be used as luminescent dopant include analogues of the Formula (4) compound which have any other substituent in place of the substituent $N(CH_3)_2$ and other analogues of the Formula (4) compound which have the substituent $N(CH_3)_2$ or any other substituent at any other position.

Synthesis of DBzA

DBzA (9,10-bis(4-(6-methylbenzothiazole-2-yl)phenyl) anthracene may be synthesized by a series of reactions as shown in the formula below. Compound A (1-iodo-(4-(6-methylbenzothiazole-2-yl)phenyl) is used as a starting material. The iodine of Compound A is replaced with lithium. The lithium-substituted product is allowed to react with anthraquinone to form Compound B, which is then converted into DBzA by dehydration reaction.

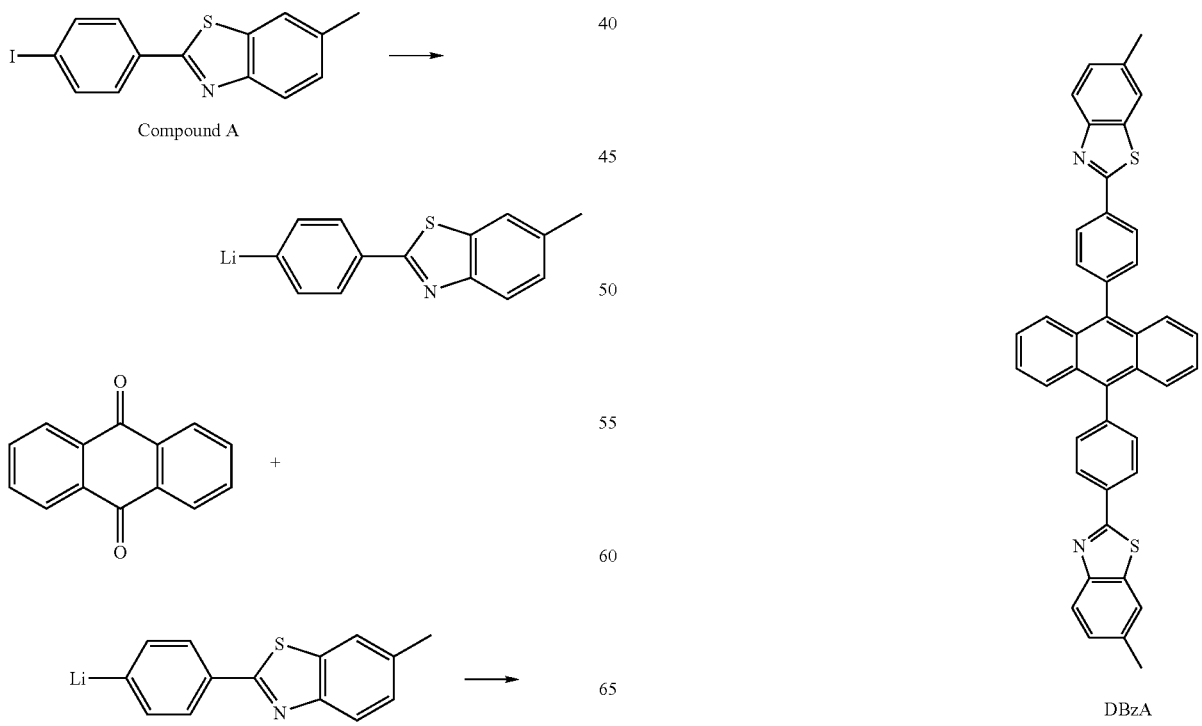

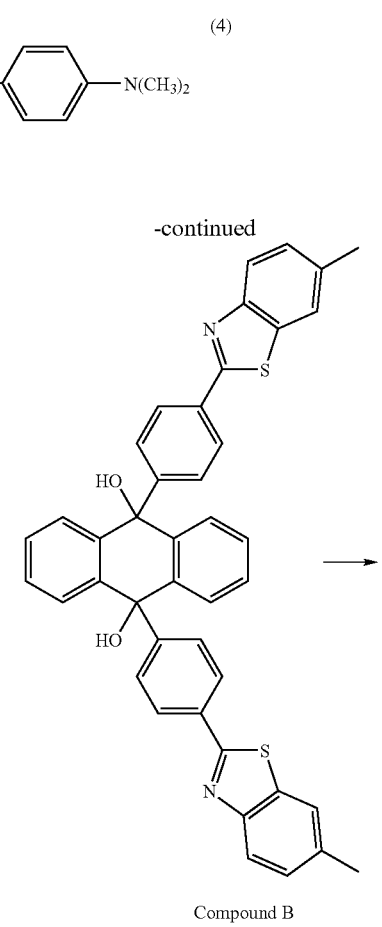

Example of DBzA Synthesis Method

Compound A (10 g, 0.0284 mol) is placed in an argon-filled glass vessel, and 100 ml of dry toluene is added thereto and stirred. A hexane solution of 1.1 equivalents of n-BuLi is added per one equivalent of Compound A and stirred. Anthraquinone (2.9 g, 0.0139 mol) is placed in an argon-filled glass vessel, and 100 ml of dry toluene is added thereto and stirred. The product of replacing iodine with Li in Compound A is slowly added dropwise to the resulting anthraquinone solution. After the addition is completed, the mixture is stirred at room temperature for 24 hours. The reaction solution is transferred to a separating funnel and washed with dilute hydrochloric acid and water. The organic layer is dried by addition of magnesium sulfate. After the drying agent is separated, the solvent is removed under reduced pressure. The resulting Compound B is purified using a silica gel column. The purified Compound B is dissolved in 300 ml of THF, and then a solution of tin chloride in hydrochloric acid is added thereto and stirred at room temperature for 12 hours. The reaction solution is transferred to a separating funnel, mixed with toluene, then washed with dilute hydrochloric acid and water, and dried by addition of magnesium sulfate. After the drying agent is separated, the solvent is removed under reduced pressure, and then the resulting DBzA is purified using a silica gel column.

The molecular weight of the resulting DBzA is measured by mass spectroscopy (MALDI-TOFMS) and found to be 624.214. The result of elemental analysis is as follows: C: 80.8% by weight, H: 4.99% by weight, N: 5.03% by weight (Calculation: C: 80.74% by weight, H: 4.52% by weight, N: 4.48% by weight).

Assist Dopant

In the examples, the phenylamine derivatives (NPB, mTPD and pTPD) each represented by the formula below are used as the assist dopants.

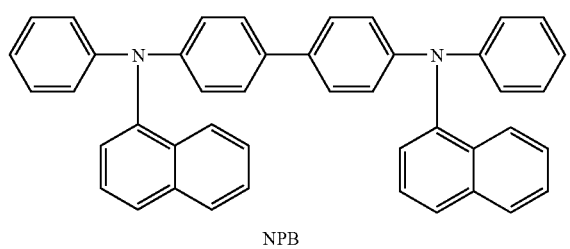

NPB

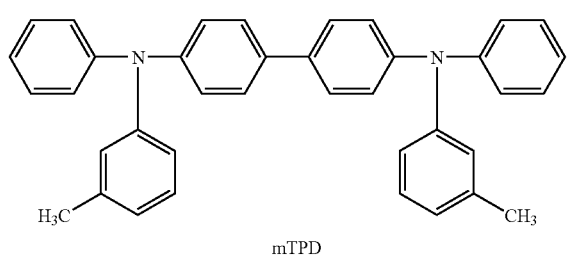

mTPD

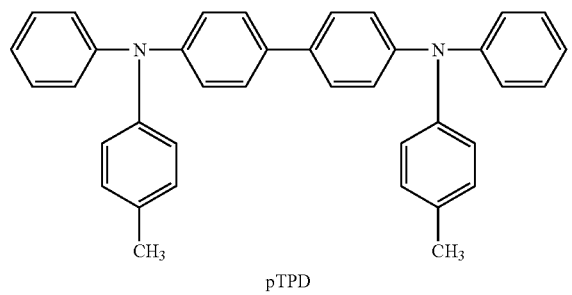

pTPD

Examples of any other phenylamine derivative to be used as assist dopant include NPB derivatives having the skeleton represented by the structural formula of NPB.

Hole-Injecting Layer

The copper phthalocyanine represented by the structural formula below (hereinafter referred to as CuPc) is used in the examples and the comparative examples.

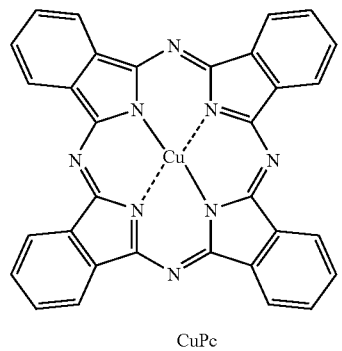

CuPc

Hole-Transporting Layer

In the examples and the comparative examples, NBP is used to form the hole-transporting layer.

Electron-Transporting Layer

In the examples and the comparative examples, tris(8-quinolinolato)aluminum represented by the structural formula below (hereinafter referred to as Alq) is used to form the electron-transporting layer.

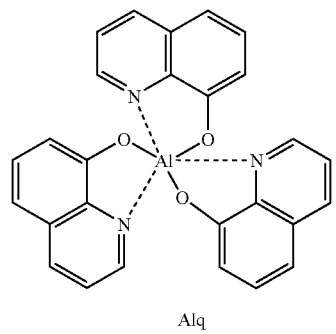

Alq

Table 1 shows the HOMO (Highest Occupied Molecular Orbital) energy level and the hole mobility of each of the host material and the assist dopants.

TABLE 1

|  |  | HOMO Energy (eV) | Hole Mobility (cm$^2$/Vs) |
|---|---|---|---|
| Host Material | DNA | 5.6 | $10^{-7}$ |
| Assist Dopant | NPB | 5.4 | $10^{-4}$ |
|  | mTPD | 5.3 | $10^{-3}$ |
|  | PTPD | 5.25 | $10^{-3}$ |

The host material DNA is an electron-transporting material, while the assist dopants NPB, mTPD and pTPD are each a hole-transporting material. As appeared in Table 1, the assist dopant materials each have a smaller absolute HOMO energy level than the host material DNA and a higher hole mobility than the host material DNA.

EXAMPLE 1

As shown in FIG. 1, a transparent hole-injecting electrode (anode) 2 made of an indium-tin compound (hereinafter referred to as ITO) was formed on a glass substrate 1, and a hole-injecting layer 3 made of CuPc (10 nm in thickness) was formed on the hole-injecting electrode 2. A hole-transporting layer 4 made of NPB (75 nm in thickness) was formed on the hole-injecting layer 3.

A blue light-emitting layer 5 was formed on the hole-transporting layer 4. The blue light-emitting layer 5 was made of a composition comprising a host material of DNA which contained 2.5% by weight of the luminescent dopant DBzA and 7% by weight of the assist dopant NPB.

An electron-transporting layer 6 (10 nm in thickness) made of Alq was formed on the blue light-emitting layer 5. An electron-injecting electrode (cathode) 7 composed of LiF (1 nm in thickness) and Al (200 nm in thickness) was formed on the electron-transporting layer 6.

Each layer was formed in a vacuum of $5\times10^{-5}$ Pa by a resistance-heating vacuum deposition method.

The organic electroluminescent device prepared as described above was evaluated for light-emitting properties. The luminous efficiency, the voltage and the chromaticity were measured when the brightness of the emitted light was 500 cd/m$^2$. The results of the measurement are shown in Table 2.

The half life (the period for which the initial brightness (500 cd/m2) is reduced to half) was measured in a constant-current continuous-emission mode. The result of the measurement is shown as lifetime in Table 2.

COMPARATIVE EXAMPLE 1

An organic electroluminescent device was prepared using the process of Example 1 except that the blue light-emitting layer was free of the assist dopant NPB. Evaluation was performed as in Example 1. The results of the evaluation are shown in Table 3.

TABLE 2

|  | Anode | Hole-Injecting Layer (Thickness: nm) | Hole-Transporting Layer (Thickness: nm) | Blue Light-Emitting Layer | | | | Electron-Transporting Layer (Thickness: nm) | Cathode (Thickness: nm) |
|---|---|---|---|---|---|---|---|---|---|
|  |  |  |  | Thickness (nm) | Host Material | Luminescent Dopant | Assist Dopant |  |  |
| Ex. 1 | ITO | CuPc(10) | NPB(75) | 40 | DNA | Formula (1) DBzA (2.5% by Weight) | NPB (7% by Weight) | Alq(10) | LiF(1)/ Al(200) |
| Comp. Ex. 1 | ITO | CuPc(10) | NPB(75) | 40 | DNA | Formula (1) DBzA (2.5% by Weight) | Absent | Alq(10) | LiF(1)/ Al(200) |

TABLE 3

|  | Luminous Efficiency (cd/A) | Voltage (V) | Chromaticity | | Lifetime (Hours) |
|---|---|---|---|---|---|
|  |  |  | x | y |  |
| Ex. 1 | 3.5 | 7.9 | 0.150 | 0.135 | 750 |
| Comp. Ex. 1 | 2.6 | 8.3 | 0.151 | 0.134 | 400 |

The results, as shown in Table 3, indicate that the organic electroluminescent device of Example 1, in which the blue light-emitting layer contains the assist dopant according to the present invention, exhibits good light-emitting properties and has a long lifetime so that good reliability can be achieved.

EXAMPLE 2

As shown in Table 4, the blue light-emitting layer of this example comprises first and second blue light-emitting layers, wherein only the first blue light-emitting layer contains the assist dopant. The first blue light-emitting layer contains 7% by weight of NPB and 2.5% by weight of DBzA and has a thickness of 10 nm. The second blue light-emitting layer contains 2.5% by weight of DBzA and has a thickness of 30 nm.

TABLE 4

| | Anode | Hole-Injecting Layer (Thickness: nm) | Hole-Transporting Layer (Thickness: nm) | First Blue Light-Emitting Layer | | | | Second Blue Light-Emitting Layer | | | | Electron-Transporting Layer (Thickness: nm) | Cathode (Thickness: nm) |
|---|---|---|---|---|---|---|---|---|---|---|---|---|---|
| | | | | Thickness (nm) | Host Material | Luminescent Dopant | Assist Dopant | Thickness (nm) | Host Material | Luminescent Dopant | Assist Dopant | | |
| Ex. 2 | ITO | CuPc(10) | NPB(75) | 10 | DNA | Formula (1) DBzA (2.5% by Weight) | NPB (7% by weight) | 30 | DNA | Formula (1) DBzA (2.5% by Weight) | Absent | Alq(10) | LiF(1)/ Al(200) |

The blue organic electroluminescent device of this example was evaluated for light-emitting properties as in Example 1. The result of the evaluation is shown in Table 5.

TABLE 5

| | Luminous Efficiency (cd/A) | Voltage (V) | Chromaticity x | Chromaticity y | Lifetime (Hours) |
|---|---|---|---|---|---|
| Ex. 2 | 5.1 | 7.1 | 0.150 | 0.136 | 1100 |

A comparison with the results of Example 1 shown in Table 3 indicates that the light-emitting properties and the reliability can be improved if the assist dopant is contained only in a partial region of the blue light-emitting layer along its thickness direction as in the Example. This is probably because the assist dopant contained restrictively in a specific region of the light-emitting layer can efficiently transfer carriers to the light-emitting region so that the recombination probability can be increased.

EXAMPLES 3 TO 6 AND COMPARATIVE EXAMPLES 2 AND 3

Blue organic electroluminescent devices were prepared using DNA as the hose material for the light emitting layer and using the process of Example 1, except that each light-emitting layer was formed using the specific content of each of the luminescent dopant and the assist dopant as shown in Table 6.

In Example 3, the blue light-emitting layer contains 2% by weight of the perylene derivative of Structural Formula (3) as a luminescent dopant and 7% by weight of NPB as an assist dopant. In Example 4, the blue light-emitting layer contains 2% by weight of the oxadiazole derivative of Structural Formula (4) as a luminescent dopant and 7% by weight of NPB as an assist dopant. In Example 5, the blue light-emitting layer contains 2% by weight of DBzA as a luminescent dopant and 7% by weight of mTPD as an assist dopant. In Example 6, the blue light-emitting layer contains 2% by weight of DBzA as a luminescent dopant and 7% by weight of pTPD as an assist dopant.

In Comparative Example 2, the blue light-emitting layer contains 2% by weight of the perylene derivative of Structural Formula (3) as a luminescent dopant and no assist dopant. In Comparative Example 3, the blue light-emitting layer contains 2% by weight of the oxadiazole derivative of Structural Formula (4) as a luminescent dopant and no assist dopant.

TABLE 6

| | Anode | Hole-Injecting Layer (Thickness: nm) | Hole-Transporting Layer (Thickness: nm) | Blue Light-Emitting Layer | | | | Electron-Transporting Layer (Thickness: nm) | Cathode (Thickness: nm) |
|---|---|---|---|---|---|---|---|---|---|
| | | | | Thickness (nm) | Host Material | Luminescent Dopant | Assist Dopant | | |
| Ex. 3 | ITO | CuPc(10) | NPB(75) | 40 | DNA | Formula (3) (2% by Weight) | NPB (7% by Weight) | Alq(10) | LiF(1)/ Al(200) |
| Ex. 4 | ITO | CuPc(10) | NPB(75) | 40 | DNA | Formula (4) (2% by Weight) | NPB (7% by Weight) | Alq(10) | LiF(1)/ Al(200) |
| Ex. 5 | ITO | CuPc(10) | NPB(75) | 40 | DNA | Formula (1) DBzA (2% by Weight) | mTPD (7% by Weight) | Alq(10) | LiF(1)/ Al(200) |
| Ex. 6 | ITO | CuPc(10) | NPB(75) | 40 | DNA | Formula (1) DBzA (2% by Weight) | pTPD (7% by Weight) | Alq(10) | LiF(1)/ Al(200) |

TABLE 6-continued

| | Anode | Hole-Injecting Layer (Thickness: nm) | Hole-Transporting Layer (Thickness: nm) | Blue Light-Emitting Layer | | | | Electron-Transporting Layer (Thickness: nm) | Cathode (Thickness: nm) |
|---|---|---|---|---|---|---|---|---|---|
| | | | | Thickness (nm) | Host Material | Luminescent Dopant | Assist Dopant | | |
| Comp. Ex. 2 | ITO | CuPc(10) | NPB(75) | 40 | DNA | Formula (3) (2% by Weight) | Absent | Alq(10) | LiF(1)/Al(200) |
| Comp. Ex. 3 | ITO | CuPc(10) | NPB(75) | 40 | DNA | Formula (4) (2% by Weight) | Absent | Alq(10) | LiF(1)/Al(200) |

Each of the organic electroluminescent devices was evaluated for light-emitting properties and lifetime as in Example 1. The results of the evaluation are shown in Table 7.

TABLE 7

| | Luminous Efficiency (cd/A) | Voltage (V) | Chromaticity x | Chromaticity y | Lifetime (Hours) |
|---|---|---|---|---|---|
| Ex. 3 | 2.4 | 8.5 | 0.151 | 0.161 | 300 |
| Ex. 4 | 2.1 | 8.8 | 0.151 | 0.18 | 240 |
| Ex. 5 | 4.2 | 7.6 | 0.15 | 0.135 | 900 |
| Ex. 6 | 4.4 | 7.5 | 0.15 | 0.135 | 980 |
| Comp. Ex. 2 | 1.8 | 8.9 | 0.151 | 0.16 | 150 |
| Comp. Ex. 3 | 1.6 | 9.3 | 0.15 | 0.181 | 100 |

The results shown in Table 7 indicate that each of Examples 3 to 6, in which the blue light-emitting layer contains the assist dopant according to the present invention, exhibits higher light-emitting properties and reliability as compared with Comparative Examples 2 and 3.

What is claimed is:

1. An organic electroluminescent device, comprising: a hole-injecting electrode; an electron-injecting electrode; and a light-emitting layer provided between the hole-injecting electrode and the electron-injecting electrode,
wherein the light-emitting layer is a blue light-emitting layer which contains a host material, a luminescent dopant and an assist dopant for complementing carrier transport of the host material, and
further wherein the luminescent dopant is an organic compound comprising an anthracene derivative represented by Structural Formula (1):

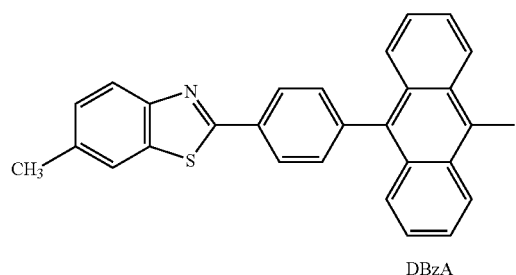

DBzA

-continued

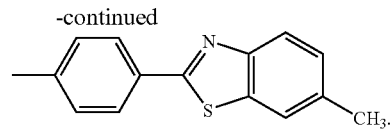

2. The organic electroluminescent device of claim 1, wherein a hole transporting material is used as the assist dopant when the host material is an electrontransporting material; or an electron-transporting material is used as the assist dopant when the host material is a hole-transporting material.

3. The organic electroluminescent device of claim 2, wherein the hole-transporting material used as the assist dopant has a smaller absolute value of HOMO (Highest Occupied Molecular Orbital) energy level than that of the host material and has a higher hole mobility than that of the host material.

4. The organic electroluminescent device of claim 2, wherein the electron-transporting material used as the assist dopant has a larger absolute value of LUMO (Lowest Unoccupied Molecular Orbital) energy level than that of the host material and has a higher electron mobility than that of the host material.

5. The organic electroluminescent device of claim 1, wherein the host material is an anthracene derivative.

6. The organic electroluminescent device of claim 1, wherein the assist dopant is a phenylamine derivative.

7. The organic electroluminescent device of claim 1, wherein the assist dopant is contained only in a partial region of the blue light-emitting layer along its thickness direction.

8. The organic electroluminescent device of claim 1, wherein the blue light-emitting layer has a luminescence peak wavelength of from 450 nm to 520 nm.

9. An organic electroluminescent device, comprising a luminescent material that is an anthracene derivative represented by Structural Formula (1):

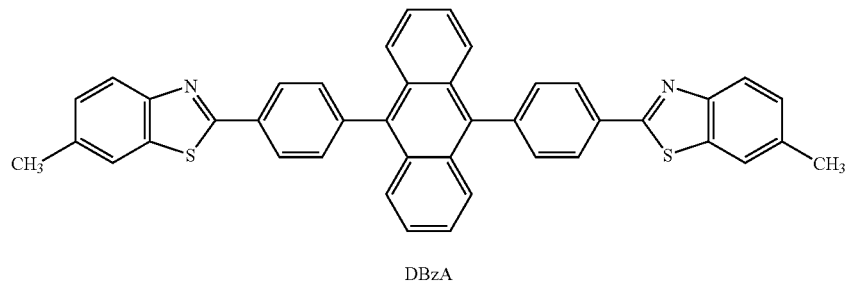
DBzA
* * * * *